(12) United States Patent
Kristal

(10) Patent No.: US 11,469,402 B2
(45) Date of Patent: Oct. 11, 2022

(54) ARRAY SUBSTRATE, DISPLAY PANEL AND DISPLAY DEVICE

(71) Applicant: BOE Technology Group Co., Ltd., Beijing (CN)

(72) Inventor: Boris Kristal, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 219 days.

(21) Appl. No.: 16/835,611

(22) Filed: Mar. 31, 2020

(65) Prior Publication Data
US 2020/0411798 A1    Dec. 31, 2020

(30) Foreign Application Priority Data

Jun. 28, 2019    (CN) .......................... 201910579349.8

(51) Int. Cl.
*H01L 51/52* (2006.01)
*H01L 51/50* (2006.01)
(Continued)

(52) U.S. Cl.
CPC ........ *H01L 51/5265* (2013.01); *H01L 51/502* (2013.01); *H01L 51/56* (2013.01);
(Continued)

(58) Field of Classification Search
CPC . G06F 1/1626; H01L 51/5265; H01L 51/502; H01L 51/56; H01L 51/5271; H01L 2251/306; H01L 2251/308; H01L 27/3241
See application file for complete search history.

(56) References Cited

U.S. PATENT DOCUMENTS

| 6,639,250 B1 * | 10/2003 | Shimoda ............. H01L 51/5036 257/98 |
| 2003/0136959 A1 | 7/2003 | Araki |

(Continued)

FOREIGN PATENT DOCUMENTS

| CN | 102074622 A | 5/2011 |
| CN | 102280548 A | 12/2011 |

(Continued)

OTHER PUBLICATIONS

Office Action for corresponding Chinese Application 201910579349.8 dated Jan. 28, 2021.

(Continued)

*Primary Examiner* — Kyoung Lee
*Assistant Examiner* — Christina A Sylvia
(74) *Attorney, Agent, or Firm* — ArentFox Schiff LLP; Michael Fainberg

(57) ABSTRACT

Disclosed are an array substrate, a display panel and a display device. The array substrate includes: a base substrate, electroluminescent devices located on the base substrates, and a reflection structure located on the side away from light exiting surfaces of the electroluminescent devices, where the reflection structure includes at least two groups of Bragg reflectors configured to reflect visible light in preset wave bands, the preset wave bands reflected by the different groups of Bragg reflectors are different, the various preset wave bands do not completely overlap, wavelength ranges of light emitted by the electroluminescent devices overlap with wavelength ranges of light reflected by the Bragg reflectors corresponding to the electroluminescent devices.

16 Claims, 4 Drawing Sheets

(51) Int. Cl.
*H01L 51/56* (2006.01)
*G06F 1/16* (2006.01)

(52) U.S. Cl.
CPC ...... *G06F 1/1626* (2013.01); *H01L 2251/306* (2013.01); *H01L 2251/308* (2013.01)

(56) References Cited

U.S. PATENT DOCUMENTS

| | | |
|---|---|---|
| 2011/0114969 A1 | 5/2011 | Lee et al. |
| 2015/0188086 A1 | 7/2015 | Hou et al. |
| 2017/0207420 A1 | 7/2017 | Yang et al. |
| 2017/0271555 A1 | 9/2017 | Kim |
| 2018/0241005 A1 | 8/2018 | Kim et al. |
| 2018/0351125 A1* | 12/2018 | He ..................... H01L 51/0003 |
| 2019/0207163 A1* | 7/2019 | Paek ................... H01L 51/5012 |

FOREIGN PATENT DOCUMENTS

| | | |
|---|---|---|
| CN | 102856453 A | 1/2013 |
| CN | 103728683 A | 4/2014 |
| CN | 105489551 A | 4/2016 |
| CN | 108140745 A | 6/2018 |
| CN | 109802050 A | 5/2019 |

OTHER PUBLICATIONS

Office Action for corresponding Chinese Application 201910579349.8 dated Sep. 3, 2021.

\* cited by examiner

ARRAY SUBSTRATE, DISPLAY PANEL AND DISPLAY DEVICE

CROSS-REFERENCE TO RELATED APPLICATION

This application claims priority of Chinese Patent Application No. 201910579349.8, filed on Jun. 28, 2019, which is hereby incorporated by reference in its entirety.

FIELD

The present disclosure relates to the technical field of displaying, and more particularly relates to an array substrate, a display panel and a display device.

BACKGROUND

An electroluminescent device includes a plurality of sub-pixels to display an image. Each sub-pixel at least includes an anode, a luminescent layer, and a cathode. In the case that the anode and the cathode provide holes and electrons for the luminescent layer to form an exciton, when the exciton descends to be in a stable bottom state, light with a predetermined wavelength is formed, that is, a luminescent device capable of emitting light in red, green, blue, and the like can be formed.

SUMMARY

In a first aspect, an embodiment of the present disclosure provides an array substrate, including: a base substrate, electroluminescent devices located on the base substrate, and a reflection structure away from light exiting surfaces of the electroluminescent device, where
the reflection structure includes at least two groups of Bragg reflectors configured to reflect visible light in preset wave bands, the preset wave bands reflected by the different groups of Bragg reflectors are different, and the preset wave bands do not completely overlap; and
the wavelength ranges of light emitted by the electroluminescent devices overlap with the wavelength ranges of light reflected by the at least two groups of Bragg reflectors corresponding to the electroluminescent devices.

In one possible implementation mode, in the array substrate provided by some embodiments of the present disclosure, each group of Bragg reflector includes at least two pairs of stacked functional layers, and each pair of the at least two pairs of stacked functional layers include a plurality of first functional layers and a plurality of second functional layers, the plurality of first functional layers and the plurality of second functional layers are stacked and have different refractive indexes; and
the plurality of first functional layers and the plurality of second functional layers are alternately arranged, the plurality of first functional layers have a same refractive index and a same thickness, and the plurality of second functional layers have a same refractive index and a same thickness.

In one possible implementation mode, in the array substrate provided by some embodiments of the present disclosure, in each pair of the at least two pairs of stacked functional layers, the refractive index of the first functional layer is less than or equal to 1.5, and the refractive index of the second functional layer is greater than or equal to 2.5.

In one possible implementation mode, in the array substrate provided by some embodiments of the present disclosure, in each pair of the at least two pairs of stacked functional layers, the first functional layer and the second functional layer are the same in thickness, and the thickness of one pair of functional layers is calculated through the following formulas:

$$\frac{\Delta f_0}{f_0} = \frac{4}{\pi} \arcsin\left(\frac{n_2 - n_1}{n_2 + n_1}\right)$$

$$d = \frac{1}{4} f_0$$

where $\Delta f_0$ represents a frequency bandwidth of a photonic band gap; $f_0$ represents a wave band corresponding to a center frequency band of the photonic band gap; $n_1$ represents the refractive index of the first functional layer; $n_2$ represents the refractive index of the second functional layer; and d represents the thicknesses of one pair of functional layers.

In one possible implementation mode, in the array substrate provided by some embodiments of the present disclosure, each group of Bragg reflector includes 2-20 pairs of functional layers.

In one possible implementation mode, in the array substrate provided by some embodiments of the present disclosure, in each pair of the at least two pairs of stacked functional layers, the first functional layer includes silicon dioxide, and the second functional layer includes titanium dioxide;
or, in each pair of the at least two pairs of stacked functional layers, the first functional layer is a first indium tin oxide layer, the second functional layer is a second indium tin oxide layer, and the oxygen concentration of the first indium tin oxide layer is different from the oxygen concentration of the second indium tin oxide layer.

In one possible implementation mode, in the array substrate provided by some embodiments of the present disclosure, the at least two groups of Bragg reflectors are stacked.

In one possible implementation mode, in the array substrate provided by some embodiments of the present disclosure, the electroluminescent devices include a red electroluminescent device, a green electroluminescent device, and a blue electroluminescent device.

In one possible implementation mode, the array substrate provided by some embodiments of the present disclosure includes two groups of Bragg reflectors. The first group of Bragg reflector is configured to reflect visible light in a wave band of 580-750 nm, and the second group of Bragg reflector is configured to reflect visible light in a wave band of 405-595 nm.

In one possible implementation mode, the array substrate provided by some embodiments of the present disclosure includes three groups of Bragg reflectors. The first group of Bragg reflector is configured to reflect visible light in a wave band of 620-750 nm, the second group of Bragg reflector is configured to reflect visible light in a wave band of 495-595 nm, and the third group of Bragg reflector is configured to reflect visible light in a wave band of 405-475 nm.

In one possible implementation mode, in the array substrate provided by some embodiments of the present disclosure, the electroluminescent devices respectively include anode layers, cathode layers, and luminescent layers located between the anode layers and the cathode layers.

In one possible implementation mode, in the array substrate provided by some embodiments of the present disclosure, a material of the cathode layers and a material of the anode layers are transparent conductive oxides.

In one possible implementation mode, in the array substrate provided by some embodiments of the present disclosure, the at least two groups of Bragg reflectors include indium tin oxide functional layers with different oxygen concentrations; and the at least two groups of Bragg reflectors are reused as the cathode layers or the anode layers of the electroluminescent devices.

In one possible implementation mode, in the array substrate provided by some embodiments of the present disclosure, the luminescent layers include a quantum dot luminescent material.

In a second aspect, an embodiment of the present disclosure further provides a manufacturing method of the array substrate provided by any one of the embodiments in the first aspect, including steps of:

providing a base substrate;
forming electroluminescent devices on the base substrate; and
forming a reflection structure on the side away from light exiting surfaces of the electroluminescent devices;
wherein the reflection structure includes at least two groups of Bragg reflectors configured to reflect visible light in preset wave bands, the preset wave bands reflected by the different groups of Bragg reflectors are different, and the various preset wave bands do not completely overlap. The wavelength ranges of light emitted by the electroluminescent devices overlap with the wavelength ranges of light reflected by the at least two groups of Bragg reflectors corresponding to the electroluminescent devices.

In one possible implementation mode, in the manufacturing method of the array substrate provided by the embodiment of the present disclosure, when the functional layers in the at least two groups of Bragg reflectors are indium tin oxide materials, the step of forming the reflection structure on the side away from the light exiting surfaces of the electroluminescent devices includes steps of:

sputtering indium tin oxide at an atmosphere having an oxygen concentration of 5% by magnetron sputtering to form a first functional layer;
sputtering indium tin oxide at an atmosphere having an oxygen concentration of 15% by magnetron sputtering to form a second functional layer; and
alternately performing the above steps until the manufacturing of the reflection structure is completed.

In a third aspect, an embodiment of the present disclosure further provides a display panel, including the array substrate provided by the embodiment in the first aspect.

In a fourth aspect, an embodiment of the present disclosure further provides a display device, including the display panel provided by the embodiment in the third aspect.

DETAILED DESCRIPTION OF THE EMBODIMENTS

Figure 1:
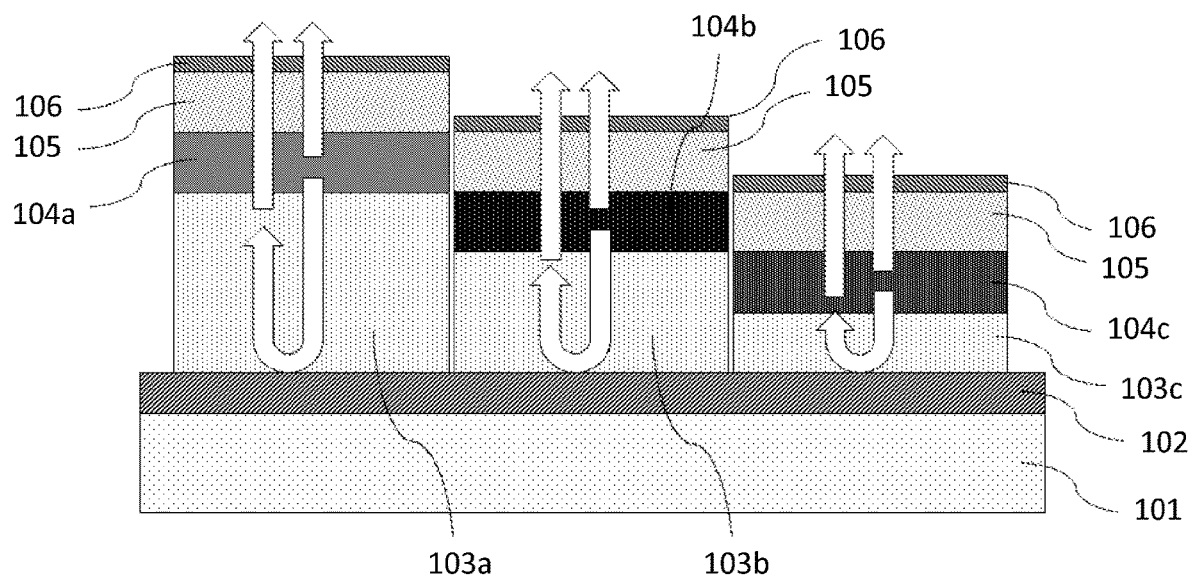
FIG. 1 is a structural schematic diagram of an array substrate in the related art.

An array substrate in the related art is as shown in FIG. 1. FIG. 1 illustrates a top-emission type array substrate, that is, a light exiting surface of the array substrate is located on the side away from a base substrate 101. The array substrate includes the base substrate 101, and metal reflection electrodes 102 located on the base substrate 101 to reflect light emitted by electroluminescent devices so as to enhance the display brightness of a display panel, and further includes: arrayed electroluminescent devices located on the sides, away from the base substrate, of the metal reflection electrodes 102. The electroluminescent devices include the metal reflection electrodes 102, hole transport layers 103 (a, b or c), luminescent layers 104 (a, b or c), electron transport layers 105 (a, b or c), and an upper electrode 106. The array substrate shown in FIG. 1 reuses the metal reflection electrodes 102 as lower electrodes of the electroluminescent devices.

It can be known from the above that in the related art, light emitted by the electroluminescent devices is reflected by the metal reflection electrodes, so as to enhance display brightness. However, a spiky structure would be formed on a metal surface since the morphology of the metal surface is affected by a manufacturing process, causing short circuiting or current leakage of the electroluminescent devices; metal ions are easily diffused into the electroluminescent devices, resulting in shortened lives of the electroluminescent devices; and a metal dielectric interface would cause emission loss due to formation of surface plasmons.

For the problem caused by a fact that the brightness of a display panel is enhanced by using the metal reflection electrodes of the array substrate in the related art, an embodiments of the present disclosure provide an array substrate, a display panel and a display device. In order to make objectives, technical solutions and advantages of the present disclosure clearer, the present disclosure is further described below in detail in combination with accompanying drawings. Obviously, the embodiments described are only one part of the embodiments of the present disclosure, but not all the embodiments. Based on the embodiments in the present disclosure, all other embodiments obtained by ordinarily those skilled in the art without doing creative work shall fall within the protection scope of the present disclosure.

Shapes and sizes of components in the accompanying drawings do not reflect real scales, and are merely to illustrate contents of the present disclosure.

Figure 2:
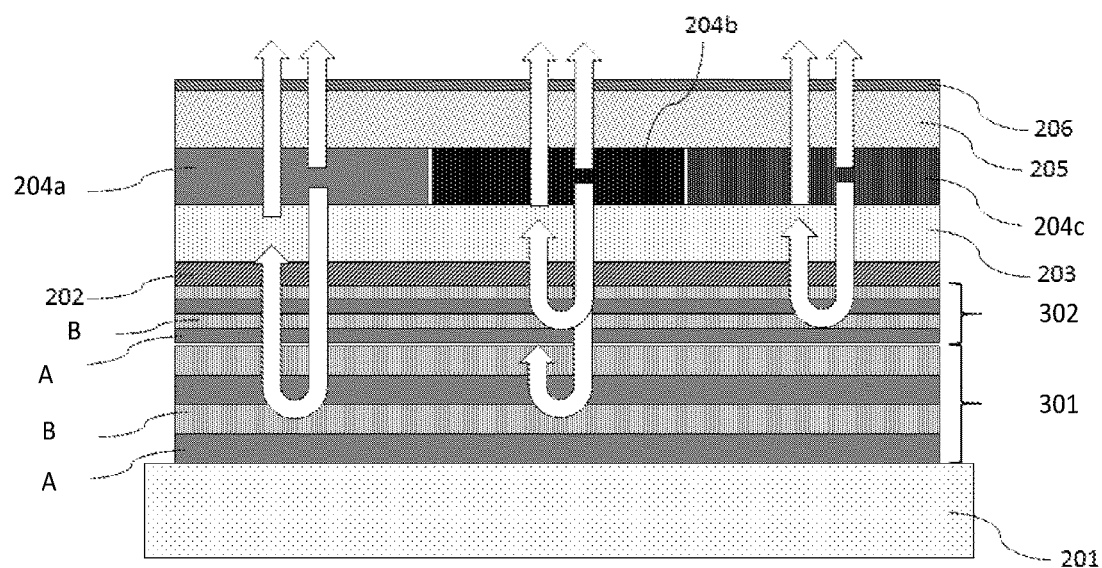
FIG. 2 is a structural schematic diagram of an array substrate provided by an embodiment of the present disclosure.

An embodiment of the present disclosure provides an array substrate, as shown in FIG. 2. The array substrate includes a base substrate 201, electroluminescent devices located on the base substrate 201, and a reflection structure located on the side away from light exiting surfaces of the electroluminescent devices.

The reflection structure includes at least two groups of Bragg reflectors (301 and 302) configured to reflect visible light in preset wave bands, the preset wave bands reflected by the different groups of Bragg reflectors (301 and 302) are different, and the various preset wave bands do not completely overlap.

The wavelength ranges of light emitted by the electroluminescent devices overlap with the wavelength ranges of light reflected by the Bragg reflectors (301 and/or 302) corresponding to the electroluminescent devices.

The electroluminescent devices shown in FIG. 2 include a red electroluminescent device (an anode layer 202, a hole transport layer 203, a red luminescent layer 204a, an electron transport layer 205, and a cathode layer 206), a green electroluminescent device (the anode layer 202, the hole transport layer 203, a green luminescent layer 204b, the electron transport layer 205, and the cathode layer 206), and a blue electroluminescent device (the anode layer 202, the hole transport layer 203, a blue luminescent layer 204c, the electron transport layer 205, and the cathode layer 206). Of course, electroluminescent devices in other colors may also be included, and no specific limitations are made here.

In the array substrate provided by the embodiment of the present disclosure, the reflection structure formed in the array substrate uses a non-metal material to avoid corresponding problems caused by a metal reflection structure. Furthermore, the reflection structure in the present disclosure realizes reflection of light emitted by the electroluminescent devices by configuring the ranges of the wavelengths reflected by the Bragg reflectors to overlap with the emission wavelengths of the corresponding electroluminescent devices. The range of wavelength reflected by the reflection structure is configured to cover the ranges of the wavelengths emitted by the electroluminescent devices, so that reflection of a full-wave band may be realized.

The Bragg reflectors corresponding to the electroluminescent devices refer to the Bragg reflectors located between the electroluminescent devices and the array substrate. The Bragg reflectors are configured to reflect light emitted by the corresponding electroluminescent devices. If the reflection structure includes three groups of stacked Bragg reflectors, and the first group of Bragg reflector is configured to reflect red light, and the second group of Bragg reflector is configured to reflect green light, and the third group of Bragg reflector is configured to reflect blue light, the first group of Bragg reflector corresponds to the red electroluminescent device, the second group of Bragg reflector corresponds to the green electroluminescent device, and the third group of Bragg reflector corresponds to the blue electroluminescent device.

It should be noted that the reflection structure includes at least two groups of Bragg reflectors because the array substrate generally includes the red electroluminescent device, the green electroluminescent device, and the blue electroluminescent device, which cover a plurality of wave bands of visible light, if one group of Bragg reflector is used to reflect the above plurality of wave bands, a difference between a refractive index of a high-refractive-index film layer and a refractive index of a low-refractive-index film layer in the Bragg reflector needs to be greater than or equal to 2, but a material with a larger refractive index difference is hard to obtain and has a high requirement on a process, and therefore, a plurality of groups of Bragg reflectors are used to reflect the plurality of wave bands to reduce difficulty.

It should be noted that the preset wave bands reflected by the different groups of Bragg reflectors are different, and the preset wave bands not completely overlapping indicates that if two groups of Bragg reflectors are included, the wave band corresponding to the first group of Bragg reflector is 580-750 nm, and the wave band corresponding to the second group of Bragg reflector may be 405-595 nm, or may be 405-570 nm. That is, the wave bands corresponding to the two groups of Bragg reflectors may partially overlap, or may not overlap, but the wave bands cannot completely overlap or one wave band covers the other wave band.

Figure 3:
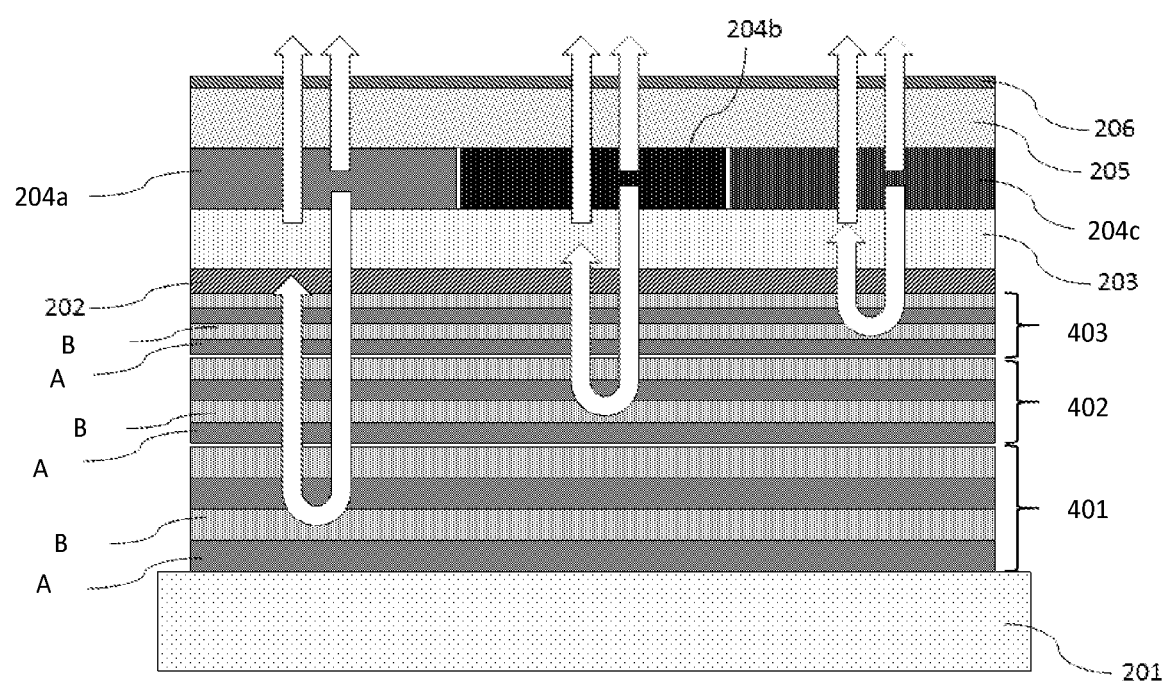
FIG. 3 is a structural schematic diagram of another array substrate provided by an embodiment of the present disclosure.

Optionally, in the array substrate provided by the embodiment of the present disclosure, as shown in FIG. 3, each group of Bragg reflector (301 or 302) includes at least two pairs of stacked functional layers, and the various pairs of functional layers include first functional layers A and second functional layers B which are stacked and have different refractive indexes; and the first functional layers A and the second functional layers B are alternately arranged, the first functional layers A have a same refractive index and a same thickness, and the second functional layers B have a same refractive index and a same thickness.

Optionally, in the array substrate provided by the embodiment of the present disclosure, each group of Bragg reflector includes at least two pairs of stacked functional layers, that is, each group of Bragg reflector at least includes four stacked functional layers arranged in a manner of a first functional layer A, a second functional layer B, a first functional layer A and a second functional layer B, where when the first functional layer is a high-refractive-index functional layer, the second functional layer is a low-refractive-index functional layer, and when the first functional layer is the low-refractive-index functional layer, the second functional layer is the high-refractive-index functional layer. Optionally, a refractive index of a high-refractive-index material is greater than or equal to 2.5, and a refractive index of a low-refractive-index material is about 1.5, so that SiO2 and TiO2, or other satisfactory materials may be used. The materials may be deposited through sputtering deposition, physical vapor deposition, chemical vapor deposition, ion beam deposition, molecular beam epitaxy or deposition by similar methods.

Optionally, in the array substrate provided by the embodiment of the present disclosure, in the same pair of functional layers, the larger a difference between a refractive index of the first functional layer and a refractive index of the second functional layer is, the larger the reflective index of the pair of functional layers is.

Optionally, the reflective index of each pair of functional layers is calculated through the following formula:

$$R = \left[ \frac{n_0(n_2)^{2N} - n_s(n_1)^{2N}}{n_0(n_2)^{2N} + n_s(n_1)^{2N}} \right]^2$$

where R represents the reflective index of each pair of functional layers; $n_0$ represents a refractive index of a source medium; $n_s$ represents a refractive index of a terminal medium; $n_1$ represents the refractive index of the low-refractive-index material; $n_2$ represents the refractive index of the high-refractive-index material; and N represents the number of pairs. The source medium is a film layer which is in contact with the pair of functional layers and close to the luminescent devices, and the terminal medium is a film layer which is in contact with the pair of functional layers and close to the base substrate.

If the difference between the refractive indexes of the pair of the first functional layer and the second functional layer is larger, the reflective index of the pair of functional layers is larger, and the number of the pairs of functional layers formed in each group of Bragg reflector is smaller, that is, a smaller number of pairs of functional layers may achieve a larger reflective index. When SiO2 and TiO2 are used as the material of the functional layers, the reflective indexes of two pairs of functional layers are over 70%, and the reflective indexes of three pairs of functional layers are over 90%.

Optionally, in the array substrate provided by the embodiment of the present disclosure, in each pair of functional layers, the refractive index of the first functional layer is less than or equal to 1.5, and the refractive index of the second functional layer is greater than or equal to 2.5.

Optionally, in the array substrate provided by the embodiment of the present disclosure, in one pair of functional layers, the first functional layer and the second functional layer are the same in thickness, and the greater the thickness is, the wider a reflection wave band of the pair of functional layers is.

Optionally, the thickness of one pair of functional layers is calculated through the following formulas:

$$\frac{\Delta f_0}{f_0} = \frac{4}{\pi} \arcsin\left(\frac{n_2 - n_1}{n_2 + n_1}\right)$$

$$d = \frac{1}{4} f_0$$

where $\Delta f_0$ represents a frequency bandwidth of a photonic band gap; $f_0$ represents a wave band corresponding to a center frequency band of the photonic band gap; $n_1$ represents the refractive index of the first functional layer; $n_2$ represents the refractive index of the second functional layer; and d represents the thicknesses of one pair of functional layers.

For the functional layer using SiO2 and TiO2 as the material, if $f_0$ is equal to 580-600 nm, the thickness d of the functional layer is 145-150 nm and the frequency bandwidth of the photonic band gap is about 210 nm, resulting in that a high-reflective-index wave band is within a range of 700-490 nm, i.e., the group of Bragg reflector is configured to reflect light in red and green wave bands.

For the functional layer using SiO2 and TiO2 as the material, if $f_0$ is equal to 500 nm, the thickness d of the functional layer is 125 nm and the frequency bandwidth of the photonic band gap is about 190 nm, resulting in that the high-reflective-index wave band is within a range of 590-405 nm, i.e., the group of Bragg reflector is configured to reflect light in blue and green wave bands.

The Bragg reflector configured to reflect the light in the red and green wave bands and the Bragg reflector configured to reflect the light in the blue and green wave bands are stacked, so as to realize reflection of the light in red, green and blue.

It can be known from the above that to reflect different continuous light, the material used by each functional layer may not be changed, and only the thickness of each functional layer in the different Bragg reflectors is changed, i.e., the wave band reflected by each group of Bragg reflector may be adjusted.

Optionally, in the array substrate provided by the embodiment of the present disclosure, each group of Bragg reflector includes a plurality of pairs of stacked functional layers.

In one Bragg reflector, the larger the number of pairs of functional layers is, the larger the refractive index of the Bragg reflector is.

Optionally, in the array substrate provided by the embodiment of the present disclosure, each group of Bragg reflector may include 2-20 pairs of functional layers.

Optionally, in the array substrate provided by the embodiment of the present disclosure, each group of Bragg reflector at least includes two pairs of functional layers, i.e., includes four functional layers, thereby forming one group of photonic crystals, realizing reflection of light in the preset wave bands, and meeting the requirement of the principle of the Bragg reflectors, where in each group of Bragg reflector, the larger the number of pairs of functional layers is, the larger the refractive index of the group of Bragg reflector is. However, in consideration of the thickness of the array substrate, when each group of Bragg reflector includes 20 pairs of functional layers, the requirement of a display surface for the reflective index may be met. For a higher reflective index, greater than 20 pairs of functional layers may be set. No specific limitations are made to the specific number.

Optionally, in the array substrate provided by the embodiment of the present disclosure, in each pair of functional layers, the first functional layer includes silicon dioxide, and the second functional layer includes titanium dioxide;

or, in each pair of functional layers, the first functional layer is a first indium tin oxide layer, the second functional layer is a second indium tin oxide layer, and the oxygen concentration of the first indium tin oxide layer is different from the oxygen concentration of the second indium tin oxide layer.

When indium tin oxide is prepared under different oxygen concentrations, indium tin oxide layers with different oxygen contents would be obtained, and have different refractive indexes corresponding to various wavelengths. The following table shows the refractive indexes, corresponding to different wavelengths, of indium tin oxide layers (ITO) obtained by a magnetron sputtering method respectively under an oxygen concentration of 5% and an oxygen concentration of 15%:

|  | IT0 (5%) | IT0 (15%) |
| --- | --- | --- |
| R (629 nm) | 2.014 | 1.728 |
| G (534 nm) | 2.063 | 1.815 |
| B (466 nm) | 2.118 | 1.887 |

As shown in the above table, the refractive indexes of the indium tin oxide layer obtained under the oxygen concentration of 5% to red (629 nm), green (534 nm) and blue (466 nm) wavelength light are respectively 2.014, 2.063 and 2.118, and the refractive indexes of the indium tin oxide layer obtained under the oxygen concentration of 15% to red (629 nm), green (534 nm) and blue (466 nm) wavelength light are respectively 1.728, 1.815 and 1.887. Therefore, the refractive indexes, corresponding to the various color wavelengths, of the indium tin oxide layer formed under the oxygen concentration of 15% are less than the refractive indexes, corresponding to the various color wavelengths, of the indium tin oxide layer formed under the oxygen concentration of 5%.

The material of the functional layer may include: silicon dioxide, titanium dioxide or indium tin oxide, and of course, is not limited to this. Other materials meeting the principle of the present disclosure fall within the protection scope of the present disclosure.

Optionally, in the array substrate provided by the embodiment of the present disclosure, as shown in FIG. 2 and FIG. 3, the various groups of Bragg reflectors (301 and 302) are stacked.

Optionally, in the array substrate provided by the embodiment of the present disclosure, compared with a mode of corresponding arrangement of the various groups of Bragg reflectors and the corresponding electroluminescent devices, a mode of stacking the various groups of Bragg reflectors may simplify a preparation process and save a production cost.

Optionally, in the array substrate provided by the embodiment of the present disclosure, the electroluminescent devices may include a red electroluminescent device, a green electroluminescent device, and a blue electroluminescent device.

Optionally, as shown in FIG. 2, when the electroluminescent devices provided by the embodiment of the present disclosure includes: the red electroluminescent device (the anode layer 202, the hole transport layer 203, the red luminescent layer 204a, the electron transport layer 205, and the cathode layer 206), the green electroluminescent device (the anode layer 202, the hole transport layer 203, the green luminescent layer 204b, the electron transport layer 205, and the cathode layer 206), and the blue electroluminescent device (the anode layer 202, the hole transport layer 203, the blue luminescent layer 204c, the electron transport layer 205, and the cathode layer 206), the array substrate may include the two groups of Bragg reflectors (301 and 302). The first group of Bragg reflector 301 is configured to reflect visible light in the red and green wave bands, and the second group of Bragg reflector 302 is configured to reflect visible light in the blue and green wave bands.

Optionally, in the array substrate provided by the embodiment of the present disclosure, when the electroluminescent devices include: the red electroluminescent device, the green electroluminescent device, and the blue electroluminescent device, i.e., a set of the wavelengths of the electroluminescent devices in three colors is within a range of 405-700 nm, and therefore, two groups of Bragg reflectors are arranged. The first group of Bragg reflector is configured to reflect visible light in the red and green wave bands (580-750 nm), and the second group of Bragg reflector is configured to reflect visible light in the blue and green wave bands (405-595 nm). The light emitted by the electroluminescent device in each color may be reflected, so as to enhance display brightness.

Optionally, as shown in FIG. 3, when the electroluminescent devices include: the red electroluminescent device, the green electroluminescent device, the array substrate may include three groups of Bragg reflectors. The first group of Bragg reflector 401 is configured to reflect visible light in the red wave band (620-750 nm), the second group of Bragg reflector 402 is configured to reflect visible light in the green wave band (495-595 nm), and the third group of Bragg reflector 403 is configured to reflect visible light in the blue wave band (405-475 nm).

Optionally, when the array substrate provided by the embodiment of the present disclosure includes the three groups of Bragg reflectors, the three groups of Bragg reflectors reflect the wave bands in different colors, for example, the configuration of the three groups of Bragg reflectors is as follows: the first group of Bragg reflector is configured to reflect visible light in the red wave band, the second group of Bragg reflector is configured to reflect visible light in the green wave band, and the third group of Bragg reflector is configured to reflect visible light in the blue wave band.

Compared with the configuration of the two groups of Bragg reflectors, the configuration of the three groups of Bragg reflectors has the advantage that each group of Bragg reflector only reflects the light emitted by the electroluminescent device in the corresponding color, which may reduce color interference between the adjacent luminescent devices.

In each group of Bragg reflector, the smaller the difference between the refractive index of the high-refractive-index functional layer and the refractive index of the low-refractive-index functional layer is, the narrower the frequency bandwidth of the photonic band gap is. When the difference between the refractive indexes is less than 0.5, strong reflectivity may be achieved within a very narrow wavelength range.

For example, the light emitted by the electroluminescent devices is in 629 nm (red), 534 nm (green), and 466 nm (blue), requiring the following formation processes: on the prepared base substrate, a first group of Bragg reflector is formed, and is configured to reflect red visible light in 629 nm and composed of two material alternating layers with a refractive index difference less than 0.5 (ITO and IZO, ITO and Al2O3, IZO and Al2O3 or analogues are placed under different oxygen concentrations in a sputtering room), and the thickness of each layer should be $f_0/4$. The $f_0$ of the first group of Bragg reflector is equal to 629 nm, and the thickness of each layer is 157 nm, so $\Delta f_0$ will be 61 nm. In order to obtain the sufficiently high reflective index, stacking is formed by at least 10 pairs of high-refractive-index layers and low-refractive-index layers;

a second group of Bragg reflector is formed on the side, away from the base substrate, of the first group of Bragg reflector. The formation process is the same as the formation process of the first group of Bragg reflector, but the layer thickness should be 133 nm, and $\Delta f_0$ is equal to 43.5 nm, where the number of pairs of functional layers included in the second group of Bragg reflector may be the same as the number of pairs of functional layers included in the first group; and a third group of Bragg reflector is formed on the side, away from the base substrate, of the second group of Bragg reflector. The formation process is the same as the formation process of the first group of Bragg reflector, but the layer thickness should be 116 nm, and $\Delta f_0$ is equal to 34 nm, where the number of pairs of functional layers included in the third group of Bragg reflector may be the same as the number of pairs of functional layers included in the first group.

The configuration mode of the above Bragg reflectors provides a very narrow spectrum for each externally coupled color (red, green, and blue), thereby realizing extremely accurate color displaying through the electroluminescent devices with a high color gamut and improving the contrast.

Figure 4:
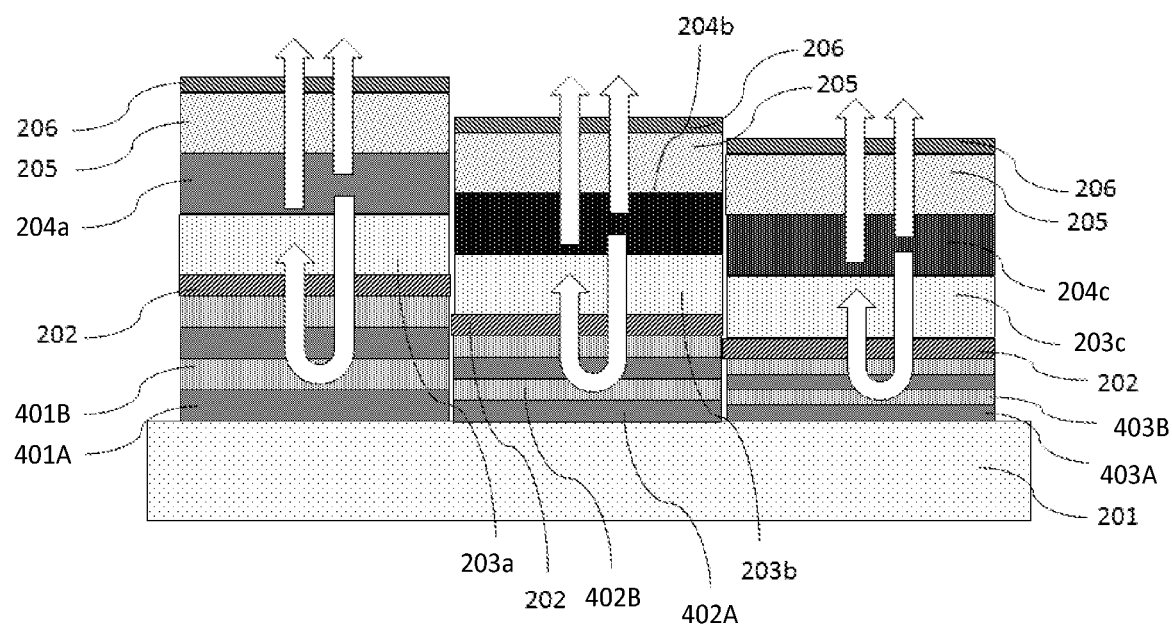
FIG. 4 is a structural schematic diagram of another array substrate provided by an embodiment of the present disclosure.

Optionally, as shown in FIG. 4, when the array substrate provided by the embodiment of the present disclosure includes three groups of Bragg reflectors (401, 402 and 403), the various groups of Bragg reflectors (401, 402 and 403) may not be stacked, and are only located between the corresponding electroluminescent devices and the base substrate. Such configuration structure may also realize the same functions of the array substrate shown in FIG. 3. The configuration is selected according to an actual usage condition, and is not specifically limited here.

Figure 5:
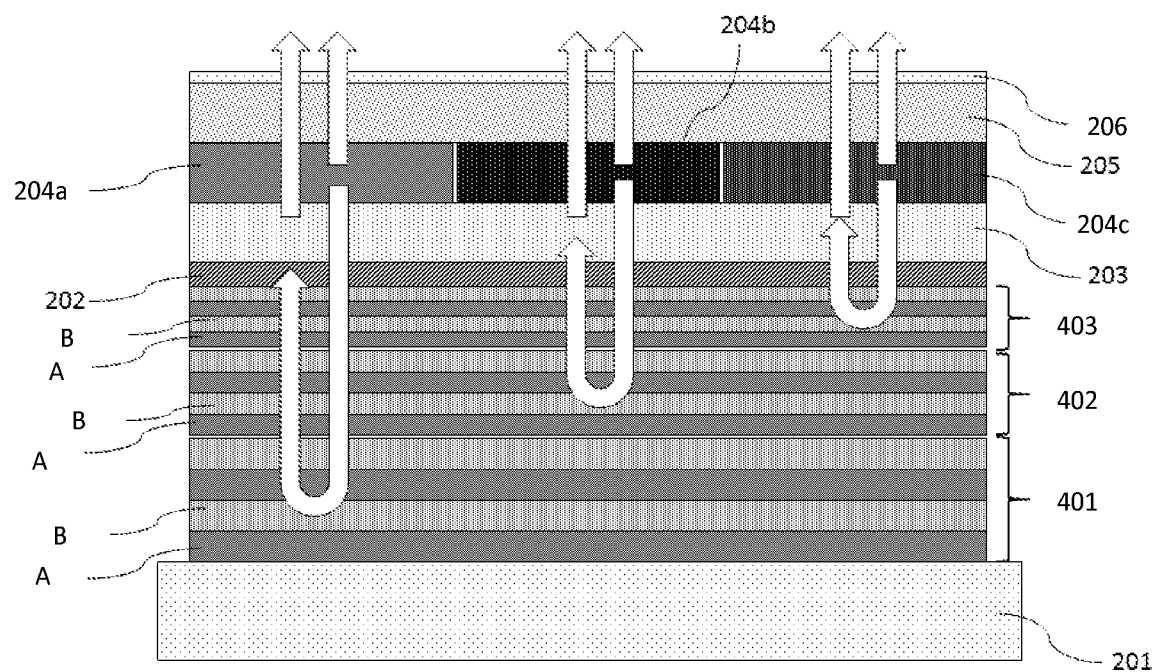
FIG. 5 is a structural schematic diagram of another array substrate provided by an embodiment of the present disclosure.

Optionally, as shown in FIG. 5, in the array substrate provided by the embodiment of the present disclosure, the anode layers 202 and the cathode layers 206 of the electroluminescent devices are transparent conductive oxides.

Optionally, the cathodes and the anodes of the electroluminescent devices are set as the transparent conductive oxides, so that a series of problems caused by the use of metal as electrodes may be avoided, and the service lives of the electroluminescent devices are better prolonged.

Optionally, in the array substrate provided by the embodiment of the present disclosure, the indium tin oxide is the transparent conductive oxide to be used as an electrode. When the Bragg reflectors are composed of the indium tin oxide functional layers at different oxygen concentrations, the Bragg reflectors may be reused as the cathode layers or the anode layers of the electroluminescent devices, thereby saving the preparation process.

The electroluminescent devices provided by the embodiment of the present disclosure include an organic electroluminescent device, an inorganic electroluminescent device, and a quantum dot electroluminescent device.

Based on the same inventive concept, an embodiment of the present disclosure further provides a manufacturing method of the array substrate provided by any one of the above embodiments, including steps that:

providing a base substrate;

forming electroluminescent devices on the base substrate; and forming a reflection structure is formed on the side away from light exiting surfaces of the electroluminescent devices, where the reflection structure includes at least two groups of Bragg reflectors configured to reflect visible light in preset wave bands, the preset wave bands reflected by the different groups of Bragg reflectors are different, the various preset wave bands do not completely overlap, and the ranges of the wavelengths emitted by the electroluminescent devices overlap with the ranges of the wavelengths reflected by the Bragg reflectors corresponding to the electroluminescent devices.

Optionally, in the manufacturing method of the array substrate provided by the embodiment of the present disclosure, when functional layers in the Bragg reflectors are indium tin oxide materials, the step that the reflection structure is formed on the side away from the light exiting surfaces of the electroluminescent devices specifically includes steps that:

sputtering indium tin oxide at an atmosphere having an oxygen concentration of 5% by magnetron sputtering to form a first functional layer;

sputtering indium tin oxide at an atmosphere having an oxygen concentration of 15% by magnetron sputtering to form a second functional layer; and alternately performing the above steps until the manufacturing of the reflection structure is completed.

Optionally, in the manufacturing method of the array substrate provided by the embodiment of the present disclosure, the refractive indexes of the indium tin oxide layers sputtered at the different oxygen concentrations are different, and the oxygen concentrations are controlled to form the first functional layer and the second functional layer in one pair of functional layers, so as to realize reflection of the corresponding visible light wave bands.

Based on the same inventive concept, an embodiment of the present disclosure further provides a display panel, including the above array substrate provided by the above embodiment.

The display panel further includes an encapsulation structure located on one side of a light exiting surface of the display panel, where the encapsulation structure covers the array substrate. The display panel further includes a circuit structure located in a bezel region of the display panel, where the circuit structure is used for providing signals to corresponding signal lines in the array substrate.

The inventive concept and the principle of the display panel provided by the embodiment of the present disclosure are the same as those of the array substrate described in the above embodiment, so that the display panel may be implemented by referring to the above embodiment, which is not repeated here.

Figure 6:
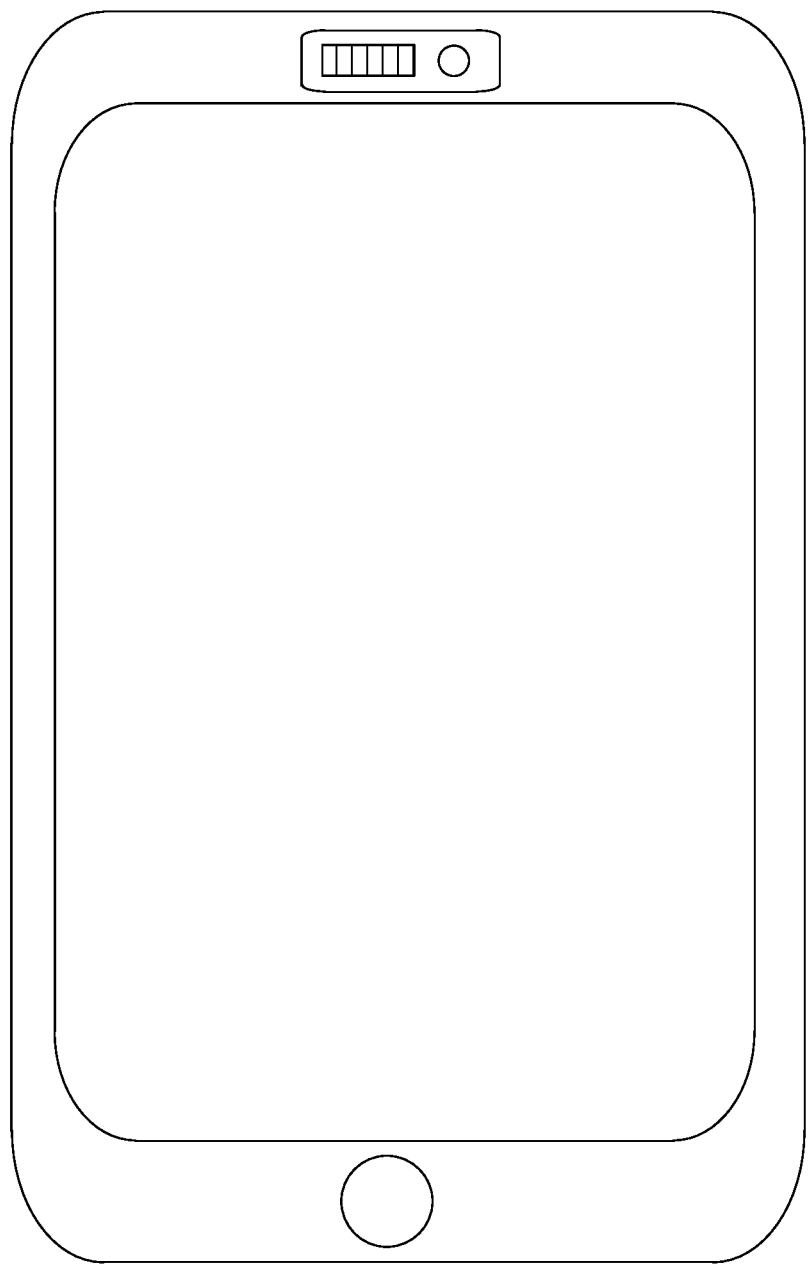
FIG. 6 is a structural schematic diagram of a display device provided by an embodiment of the present disclosure.

Based on the same inventive concept, as shown in FIG. 6, an embodiment of the present disclosure further provides a display device, including the display panel provided by the above embodiment.

Optionally, the display device may further include a battery, a protection housing, a camera, a telephone receiver, a loudspeaker, a photosensitive element, and other structures. According to different types of display devices, the display device may include one of or a combination of the above structures, and will not be specifically limited here.

The display device is applicable to various types of displays, such as an organic electroluminescent display, an inorganic electroluminescent display, and an Active Matrix/Organic Light Emitting Diode (AMOLED) display. The display device may be any product or component having a display function, such as a mobile phone, a tablet computer, a television, a display, a notebook computer, a digital photo frame and a navigator, and is not limited here.

The embodiments of the present disclosure provide the array substrate, the display panel and the display device. The array substrate includes the base substrate, the electroluminescent devices located on the base substrate, and the reflection structure located on the side away from the light exiting surfaces of the electroluminescent devices, where the reflection structure includes the at least two groups of Bragg reflectors configured to reflect the visible light in the preset wave bands. The preset wave bands reflected by the different groups of Bragg reflectors are different, and the various preset wave bands do not completely overlap. The ranges of the wavelengths emitted by the electroluminescent devices overlap with the ranges of the wavelengths reflected by the Bragg reflectors corresponding to the electroluminescent devices. The reflection structure formed in the array substrate provided by the present disclosure uses an insulating material to avoid corresponding problems caused by a metal reflection structure. Furthermore, the reflection structure in the present disclosure realizes reflection of the light emitted by the various electroluminescent devices by configuring the ranges of the wavelengths reflected by the Bragg reflectors to overlap with the emission wavelengths of the corresponding electroluminescent devices.

Obviously, those skilled in the art can make various changes and modifications to the present disclosure without departing from the spirit and scope of the present disclosure. Therefore, if the changes and modifications of the present disclosure fall within the scope of the claims of the present disclosure and equivalent technologies thereof, the present disclosure is intended to include the changes and modifications.

The invention claimed is:

1. An array substrate, comprising: a base substrate, electroluminescent devices located on the base substrate, and a reflection structure located on a side away from light exiting surfaces of the electroluminescent devices, wherein the reflection structure comprises at least two groups of Bragg reflectors configured to reflect visible light in preset wave bands, and the preset wave bands reflected by different groups of Bragg reflectors are different, and the preset wave bands do not completely overlap; and wavelength ranges of light emitted by the electroluminescent devices overlap with wavelength ranges of light reflected by the at least two groups of Bragg reflectors corresponding to the electroluminescent devices;

wherein the electroluminescent devices respectively comprise an anode layer, a cathode layer, and a luminescent layer located between the anode layer and the cathode layer;

wherein the at least two groups of Bragg reflectors comprise indium tin oxide functional layers with different oxygen concentrations; and the at least two groups of Bragg reflectors are reused as the cathode layer or the anode layer of the electroluminescent devices.

2. The array substrate according to claim 1, wherein each of the at least two groups of Bragg reflectors comprises at least two pairs of stacked functional layers, and each pair of the at least two pairs of stacked functional layers comprise a plurality of first functional layers and a plurality of second functional layers, the plurality of first functional layers and the plurality of second functional layers are stacked and have different refractive indexes; and the plurality of first functional layers and the plurality of second functional layers are alternately arranged, and the plurality of first functional layers have a same refractive index and a same thickness, and the plurality of second functional layers have a same refractive index and a same thickness.

3. The array substrate according to claim 2, wherein in each pair of the at least two pairs of stacked functional layers, a refractive index of a first functional layer is less than or equal to 1.5, and a refractive index of a second functional layer is greater than or equal to 2.5.

4. The array substrate according to claim 2, wherein in each pair of the at least two pairs of stacked functional layers, the first functional layer and the second functional layer are same in thickness, and a thickness of one pair of functional layers is calculated through following formulas:

$$\frac{\Delta f_0}{f_0} = \frac{4}{\pi}\arcsin\left(\frac{n_2 - n_1}{n_2 + n_1}\right)$$

$$d = \frac{1}{4}f_0$$

where $\Delta f_0$ represents a frequency bandwidth of a photonic band gap; $f_0$ represents a wave band corresponding to a center frequency band of the photonic band gap; $n_1$ represents the refractive index of the first functional layer; $n_2$ represents the refractive index of the second functional layer; and d represents the thicknesses of one pair of functional layers.

5. The array substrate according to claim 2, wherein each group of Bragg reflector comprises 2-20 pairs of functional layers.

6. The array substrate according to claim 2, wherein in each pair of the at least two pairs of stacked functional layers, the first functional layer comprises silicon dioxide, and the second functional layer comprises titanium dioxide; or, in each pair of the at least two pairs of stacked functional layers, the first functional layer is a first indium tin oxide layer, the second functional layer is a second indium tin oxide layer, and an oxygen content of the first indium tin oxide layer is different from an oxygen content of the second indium tin oxide layer.

7. The array substrate according to claim 1, wherein the at least two groups of Bragg reflectors are stacked.

8. The array substrate according to claim 1, wherein the electroluminescent devices comprise a red electroluminescent device, a green electroluminescent device, and a blue electroluminescent device.

9. The array substrate according to claim 8, comprising two groups of Bragg reflectors, wherein a first group of Bragg reflector is configured to reflect visible light in a wave band of 580-750 nm, and a second group of Bragg reflector is configured to reflect visible light in a wave band of 405-595 nm.

10. The array substrate according to claim 8, comprising three groups of Bragg reflectors, wherein a first group of Bragg reflector is configured to reflect visible light in a wave band of 620-750 nm, a second group of Bragg reflector is configured to reflect visible light in a wave band of 495-595 nm, and a third group of Bragg reflector is configured to reflect visible light in a wave band of 405-475 nm.

11. The array substrate according to claim 1, wherein a material of the cathode layer and a material of the anode layer are transparent conductive oxides.

12. The array substrate according to claim 1, wherein the luminescent layer comprise a quantum dot luminescent material.

13. A display panel, comprising the array substrate according to claim 1.

14. A display device, comprising the display panel according to claim 13.

15. A manufacturing method of the array substrate according to claim 1, comprising steps of:
providing a base substrate;
forming electroluminescent devices on the base substrate;
forming a reflection structure on a side away from light exiting surfaces of the electroluminescent devices,
wherein the reflection structure comprises at least two groups of Bragg reflectors configured to reflect visible light in preset wave bands, the preset wave bands reflected by different groups of Bragg reflectors are different, the preset wave bands do not completely overlap, and wavelength ranges of light emitted by the electroluminescent devices overlap with wavelength ranges of light reflected by the at least two groups of Bragg reflectors corresponding to the electroluminescent devices.

16. The manufacturing method of the array substrate according to claim 15, wherein when stacked functional layers in the at least two groups of Bragg reflectors are made from indium tin oxide materials, the step of forming the reflection structure on the side away from the light exiting surfaces of the electroluminescent devices comprises:
sputtering indium tin oxide at an atmosphere having an oxygen concentration of 5% by magnetron sputtering to form a first functional layer;
sputtering indium tin oxide at an atmosphere having an oxygen concentration of 15% by magnetron sputtering to form a second functional layer; and
alternately performing above steps until the manufacturing of the reflection structure is completed.

* * * * *